United States Patent
Pulli et al.

(10) Patent No.: US 6,310,428 B1
(45) Date of Patent: Oct. 30, 2001

(54) PIEZOELECTRIC SWITCH WITH AUDIBLE FEEDBACK

(75) Inventors: Hannu H. Pulli, Westborough; Frank M. Domzalski, Wellesley, both of MA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/449,412

(22) Filed: Nov. 26, 1999

(51) Int. Cl.[7] .................................................. H01L 41/04
(52) U.S. Cl. ......................... 310/339; 310/317; 310/318; 310/316.01
(58) Field of Search .................................. 310/328, 339, 310/316.01, 317, 318

(56) References Cited

U.S. PATENT DOCUMENTS

| | | | |
|---|---|---|---|
| 4,028,502 | 6/1977 | Moricca et al. ........................ 179/99 |
| 4,334,280 | * 6/1982 | McDonald ............................ 318/687 |
| 4,401,896 | 8/1983 | Fowler et al. ........................ 307/118 |
| 4,430,595 | 2/1984 | Nakasone et al. .................... 310/339 |
| 4,642,433 | 2/1987 | Murata ................................. 200/308 |
| 4,857,887 | 8/1989 | Iten ........................................ 341/34 |
| 4,896,069 | * 1/1990 | Rosenberg et al. .................. 310/339 |
| 5,004,880 | 4/1991 | Koutaka ................................ 200/521 |
| 5,015,811 | 5/1991 | Moriyama et al. ................... 200/521 |
| 5,216,316 | 6/1993 | Ipcinski ................................. 310/338 |
| 5,231,326 | * 7/1993 | Echols .................................. 310/339 |
| 5,332,944 | * 7/1994 | Cline .................................... 310/339 |
| 5,442,150 | 8/1995 | Ipcinski ................................. 200/181 |
| 5,636,729 | 6/1997 | Wiciel .................................. 200/181 |
| 5,770,914 | * 6/1998 | Pease et al. .......................... 310/339 |
| 5,901,834 | 5/1999 | Inubushi et al. ..................... 200/314 |
| 6,064,141 | * 5/2000 | Wiciel .................................. 310/339 |
| 6,218,966 | * 4/2001 | Goodwin et al. ....................... 341/27 |

FOREIGN PATENT DOCUMENTS 63-238800 * 10/1988 (JP) .
11-120854 * 4/1999 (JP) .

* cited by examiner

*Primary Examiner*—Nestor Ramirez
*Assistant Examiner*—Peter Medley
(74) *Attorney, Agent, or Firm*—Pearson & Pearson, LLP

(57) ABSTRACT

A piezoelectric switch comprising an end surface which when pressure is applied, causes a piezoelectric element to switch and generate an electrical signal. In addition, the piezoelectric element provides audible feedback to an operator activating the switch. The piezoelectric switch comprises a plastic housing having the piezoelectric element adhesively attached to an inside surface of a top portion of the housing. Two wires from the piezoelectric element connect to a printed circuit board which is placed adjacent to the piezoelectric element and wires from the printed circuit board extend through a cap for external connections. When the piezoelectric element switches, an output pulse having a predetermined pulse width is generated along with a signal which is fed back to trigger an oscillator connected to the piezoelectric element causing it to buzz, thereby providing audible feedback from the same piezoelectric element.

18 Claims, 4 Drawing Sheets

PIEZOELECTRIC SWITCH WITH AUDIBLE FEEDBACK

BACKGROUND OF THE INVENTION

1. Field of the Invention

This invention relates to a piezoelectric switch and in particular to a piezoelectric switch having a circuit with a piezoelectric element incorporated in the switch housing which provides a pulse output, and an oscillating signal to the piezoelectric element for producing audible feedback when the piezoelectric element is activated by mechanical stress.

2. DESCRIPTION OF RELATED ART

Piezoelectric switches in the prior art have not incorporated an audible feedback using a piezoelectric element within the switch housing for detection by an operator activating the switch. If such a switch did exist, it could be used in current piezoelectric switch applications which do not have tactile or audio feedback.

The piezoelectric switch produces a momentary pulse; it is an all-electronic switch having no contact arcing or bounce and no movable parts or mechanical wear. Such a switch is a normally-open momentary, single pole, single throw (SPST).

In U.S. Pat. No. 4,028,502, issued Jun. 7, 1997 to Moricca et al., and assigned to Inventive Industries, Inc., an apparatus is described for providing auditory and tactile recognition of a light signal associated with a line-selector pushbutton of a multi-line telephone instrument. A photo cell senses a light signal and an oscillator generates a sine wave voltage which is amplified and applied to excite a piezoelectric crystal into vibration in response to activation of the photo cell. An auxiliary pushbutton is disposed in alignment with the line selector pushbutton so that manual depression of the auxiliary pushbutton actuates the line selector pushbutton. Vibration of the crystal in response to the light signal acts upon an auxiliary pushbutton to import the vibration thereto so that the presence of the light signal is sensed by a blind person by vibration of the auxiliary pushbutton.

In U.S. Pat. No. 4,430,595, issued Feb. 7, 1984 to Nakasone et al. and assigned to Toko Kabushiki Kaisha of Japan, a piezoelectric pushbutton switch is described comprising a housing with terminals embodied in four corners, a printed circuit board, a disk-shaped piezoelectric plate polarized in the direction of thickness and having its upper surface bonded to a conductive plate, a domed-shaped metal spring placed on the conductive plate, and a plunger placed on the metal spring 8. A cover has a through-hole into which the plunger is inserted. When the spring is bent, the operator can feel a clicking motion through the plunger and the finger. The piezoelectric plate floats free of the housing by being supported by a protruding piece on the flexible printed circuit board.

In U.S. Pat. No. 4,642,433, issued Feb. 10, 1987, to Taneo Murata, and assigned to Alps Electric Company, Ltd. of Japan a pushbutton switch with aural confirmation of operation is described. The switch used in a keyboard gives a tactile feel to the finger of the operator like a clicking and at the same time produces a clicking sound. The switch comprises a casing, a membrane switching device in the casing, a stem, a contact spring and a leaf spring which produces a clicking sound.

In U.S. Pat. No. 5,636,729, issued Jun. 10, 1997 to Richard Wiciel, a piezoelectric switch with a lighted pushbutton is described. The switch comprises a light-transmissive member having a first surface accessible to a tactile input and a second surface opposite the first surface, a case for mounting the member, a piezoelectric crystal mounted to the case and having a contact area, a light source disposed in the case, a spacer for transmitting the tactile input to the crystal causing the crystal to provide an electrical response to the tactile input to an electronic circuit.

SUMMARY OF THE INVENTION

Accordingly, it is therefore an object of this invention to provide a user of a piezoelectric pushbutton switch with audible feedback.

It is another object of the invention to use a piezoelectric element both as a switch and the source of audible sound in the same circuit.

It is a further object of this invention to minimize the circuit components so that a printed circuit board can fit within the piezoelectric switch housing.

It is yet another object of this invention to provide a piezoelectric switch comprising audible feedback which can easily replace a piezoelectric switch without audible feedback.

These and other objects are further accomplished by a piezoelectric pushbutton switch having audible feedback comprising a housing for enclosing components of the switch, a piezoelectric element attached to an inner top surface of the housing wherein applying pressure on the top of the housing causes the piezoelectric element to generate an electrical signal, a circuit board electrically connected to the piezoelectric element, for receiving the electrical signal, and the circuit board comprises circuit means for enabling the piezoelectric switch to generate an output signal having a predetermined pulse width and for enabling the piezoelectric element to provide the audible feedback. The piezoelectric element comprises electrical leads for providing electrical connection to the circuit means. The circuit means connected to the piezoelectric element comprises means for providing electrical connections outside of the switch. The housing comprises a cap for closing an open end of the switch, the camp comprises an opening for feeding electrical connections outside of the switch. The sound produced by the piezoelectric element comprises a buzzing. The enabling means comprises an oscillator circuit coupled to the piezoelectric element for producing the audible feedback. The housing comprises an epoxy for securing the components of the switch.

The objects are further accomplished by a piezoelectric switch comprising a piezoelectric element, means for sensing an electrical signal output from the piezoelectric element when activated, means connected to the electrical signal output of the sensing means for generating a pulse having a predetermined pulse width, and means connected to an output of the pulse generating means for generating an oscillating signal, the oscillating signal being coupled to the piezoelectric element for producing an audible feedback. The piezoelectric element output sensing means comprises a switch sensor circuit. The pulse generating means comprises a one-shot circuit.

The objects are further accomplished by a method of providing a piezoelectric pushbutton switch having audible feedback comprising the steps of, providing a housing for enclosing components of the switch attaching a piezoelectric element to an inner top surface of the housing wherein applying pressure on the top of the housing causes the piezoelectric element to switch and generate an electrical signal, providing a circuit board in the housing electrically connected to the piezoelectric element for receiving the electrical signal, generating an output signal having a predetermined pulse width from circuit means on the circuit board receiving the electrical signal, and generating an oscillating signal within the circuit means, the oscillating signal being connected to the piezoelectric element for producing the audible feedback. The step of attaching the piezoelectric element to an inner top surface of the housing comprises the step of providing electrical leads for connection to the circuit board. The step of providing a circuit board in the housing comprises the step of providing electrical leads extending from the circuit board outside of the housing. The step of providing a housing for enclosing components of the switch comprises the steps of adding an epoxy in the housing and a cap for closing an open end of the housing. The step of providing the cap comprises the step of including an opening in the cap for feeding electrical connections outside of the housing.

The objects are further accomplished by a method of providing a piezoelectric switch having audible feedback comprising the steps of providing a piezoelectric element in the switch, sensing an output of the piezoelectric element when the switch is activated, generating a pulse having a predetermined pulse width with means connected to an output of the means for sensing the piezoelectric element output, generating an oscillatory signal with means connected to an output of the pulse generating means, and coupling the oscillatory signal to the piezoelectric element to produce the audible feedback. The step of activating the switch comprises the step of providing a mechanical stress to a portion of the housing above the piezoelectric element. The step of generating a pulse having a predetermined pulse width comprises the step of providing a one-shot circuit.

Additional objects, features and advantages of the invention will become apparent to those skilled in the art upon consideration of the following detailed description of the preferred embodiment exemplifying the best mode of carrying out the invention as presently perceived.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENT

Figure 1:
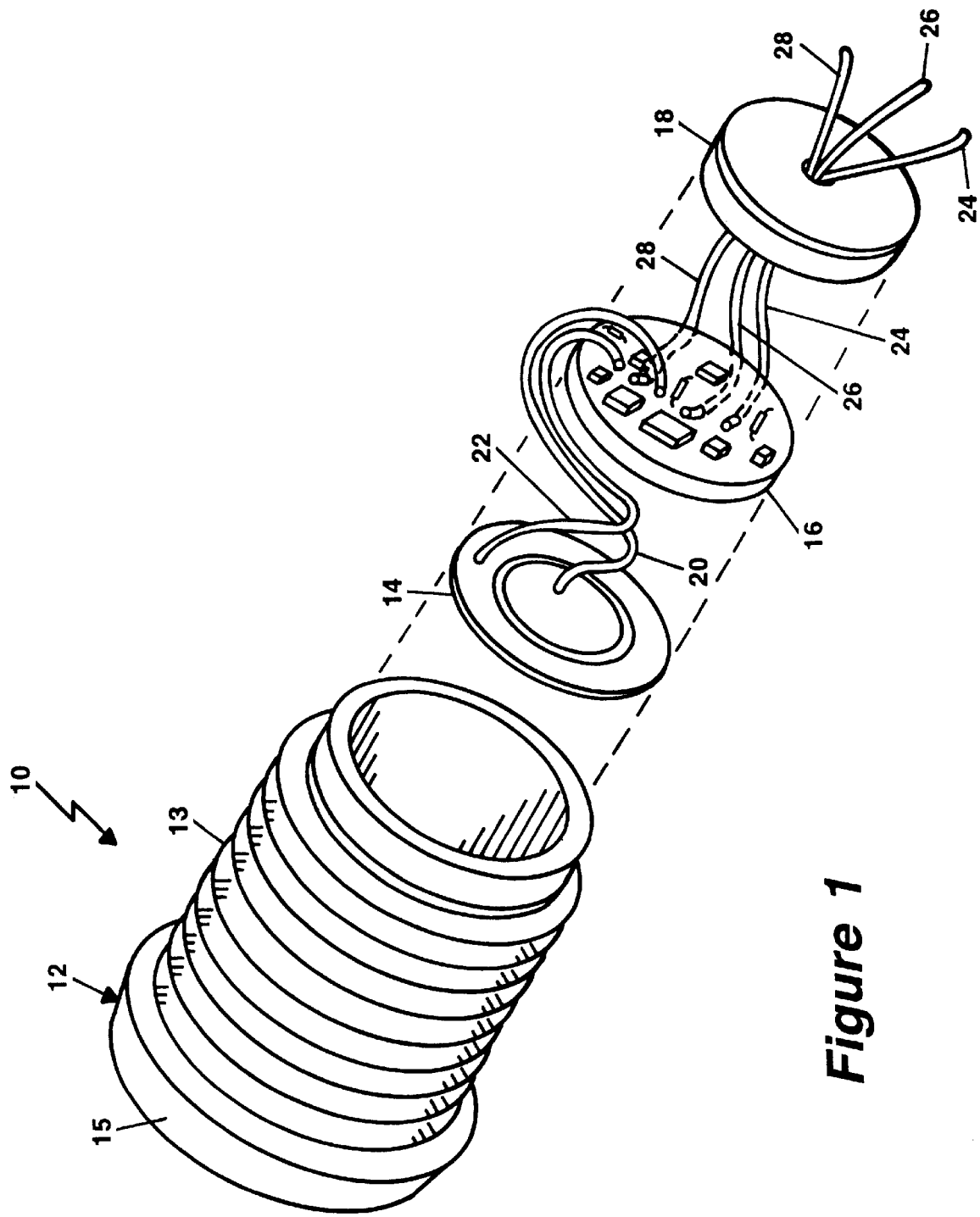
FIG. 1 is an exploded perspective view of a piezoelectric pushbutton switch according to the invention.

Referring to FIG. 1 an exploded perspective view of a piezoelectric pushbutton switch 10 is shown which provides audible feedback to a person activating the switch 10. The switch 10 comprises a housing 12 and a cap 18 which covers the bottom opening of the housing 12. The housing 12 comprises a cylindrical side wall having external threads 13 for mounting of the switch 10 by means of a threaded nut (now shown).

Figure 3:
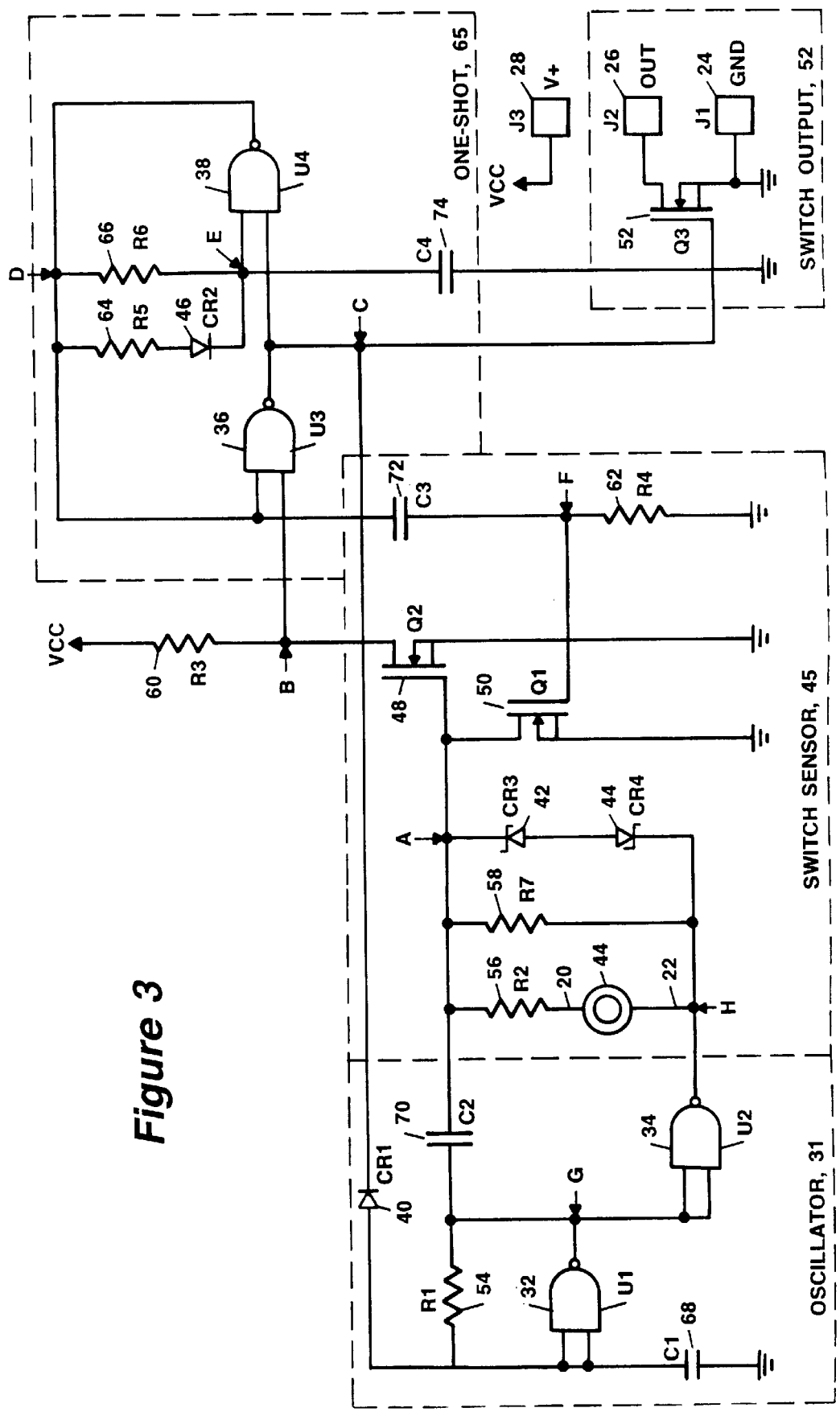
FIG. 3 is a schematic diagram of the piezoelectric pushbutton switch circuit.

A disk like ceramic piezoelectric element 14 is secured to the inside of the top button 15 of the housing 12 by a double sided adhesive tape 19 (not shown). When pressure is applied to the top button 15 of the housing 12, the piezoelectric element 14 is mechanically stressed and activated. Two wires 20, 22 extending from the piezoelectric element 14 provide electrical connection to an electronic circuit 30 as shown in FIG. 3 mounted on a printed circuit board 16 for receiving the element 14 output. The circuit 30 has three wire leads extending therefrom, including an output lead 26, a ground lead 24, and a voltage lead 28. Although the printed circuit board 16 is shown having the components facing the cap 18 for clarity, the board 16 is preferably flipped over so the components face the piezoelectric element 14 and the wires 20, 22 do not extend over the side of the printed circuit board 16; also, wires 24, 26, 28 extend directly from the back of the board 16 through an opening in the cap 18.

As shown in FIG. 1, the leads 24, 26, 28 pass through the opening in the cap 18 for electrical connection to another circuit. The voltage lead 28 provides the input voltage for the circuit 30 components to operate. The printed circuit board 16 is secured within the housing 12 adjacent to the piezoelectric element 14 and the cap 18 by epoxy 17 (not shown) or other restraining means commonly known in the art such as a potting material that hardens after being poured into the housing 12.

Figure 2:
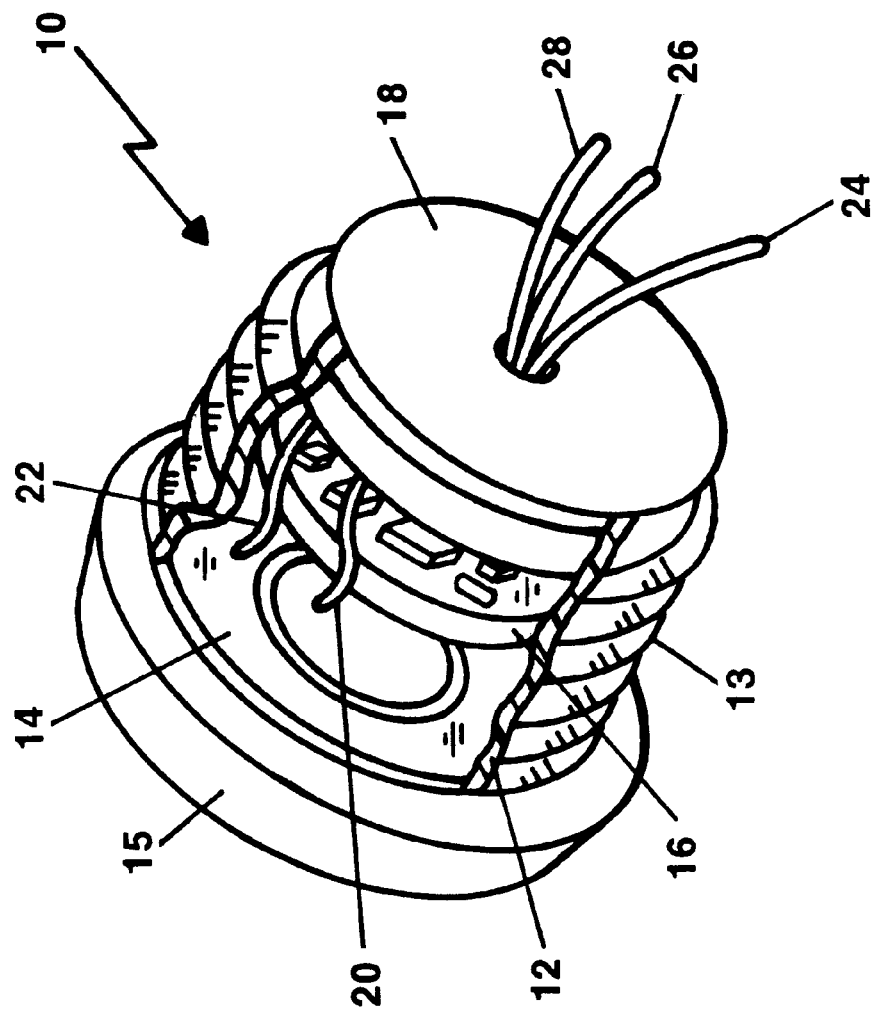
FIG. 2 is a perspective view of the piezoelectric pushbutton switch having a portion of the housing broken away showing the internal components of the switch.

Referring now to FIG. 2, a perspective view of the switch, 10 with a portion of the housing 12 broken away shows the placement of the piezoelectric element 14 adjacent to the top button 15, and the printed circuit board 16 within the housing 12. The piezoelectric element 14 is attached by adhesive tape 19 (not shown) to the inside of the top button 15 portion of the housing 12. The wires 20, 22 are folded and the printed circuit board 16 is pushed into the housing 12. As noted above, it is preferable to flip the printed circuit board 16 over so that the components face the piezoelectric element 14, and the wires 20, 22 do not extend over the side or circumference of the printed circuit board 16. The epoxy 17 secures the board 16 within the housing 12, the folded wires 20, 22, 24, 26, 28, and attaches to the cap 18. The wires 24, 26, 28 extending from the printed circuit board 16 are inserted through an opening in the cap 18 which is placed in the bottom of the housing 12, thereby closing the internal chamber of the housing 12. The housing 12 may be made of a plastic material commonly known in the art, but metal may also be used. The printed circuit board 16 comprises electrical components mounted thereon as listed in the Table.

Figure 4:
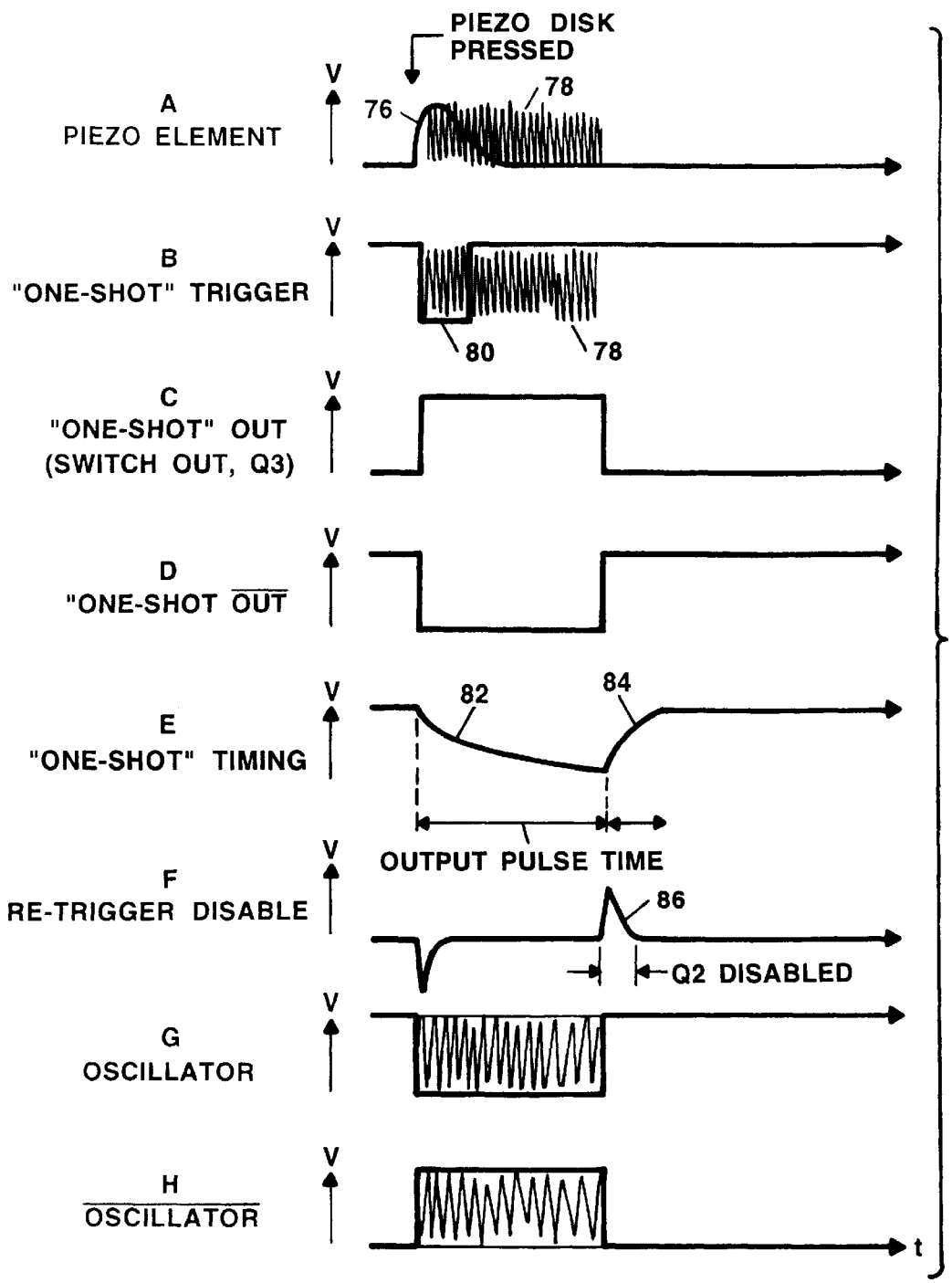
FIG. 4 shows the operational voltage waveforms at points A through H in the circuit of FIG. 3 when the piezoelectric switch is activated.

Referring now to FIG. 3, and FIG. 4, FIG. 3 is a schematic diagram of the piezoelectric circuit 30 which is packaged on the printed circuit board 16 except for the piezoelectric element 14. FIG. 4 shows operational voltage waveforms at points A through H within the circuit 30. The piezoelectric circuit 30 comprises the following four functional circuits; an oscillator 32, a switch sensor 45, a one-shot 65 and a switch output 52. The switch sensor 45 comprises components X1, R2, R7, CR3, CR4, Q2, Q1, C3 and R4.

Initially, there is no voltage across the piezoelectric element (X1) 14, Q2 is not conducting, and the voltage at point B is pulled to Vcc by R3. Mechanical stress applied to the piezoelectric element X1 produces a voltage, which causes Q2 to conduct, and the voltage at point B goes low which triggers the one-shot circuit 65. R7 is a discharge resistor for X1. CR3 and CR4 are Zener diodes protecting circuits from high voltages, which may be produced by piezoelectric element (X1) 14. R2 is a current limiting resistor protecting CR3 and CR4.

After the switch cycle, Q1 is activated for a short period to prevent re-triggering of the switch circuit. Re-trigger delay is determined by the time constant function of R4 and C3.

The one-shot circuit 65 comprises U3, U4, R5, CR2, R6 and C4 and it controls the duration of the output pulse and feedback signal. When the one-shot circuit 65 is triggered, the output of the one-shot circuit 65 (Point C) goes high enabling the oscillator 31 and the switch output transistor (Q3) 52. The output at point C stays high until C4 has discharged below threshold level of U4 causing the one-shot circuit 65 to reset. C4 is quickly recharged through R5 and CR2.

The oscillator circuit 31 comprises U1, U2, R1, C1, C2, CR1, which connects across R2, X1. R1, C1 and U1 comprise a free running oscillator, which is normally disabled by the one-shot. 65 through diode CR1. During the switch cycle, the voltage at point C is high enabling the oscillator 31. U1 and U2 comprise a bridge output increasing the output signal to X1 which results in the piezoelectric element (X1) 14 producing an audible sound such as a buzzing. C2 is used to AC couple the switch sensor 45 from the oscillator 31.

The part numbers of the components or values are listed in the following Table:

| Component | Reference No. | Description |
| --- | --- | --- |
| U1 U2 U3 U4 | 32, 34, 36, 38 | 4093 Nand Gates |
| CR1 R2 | 40, 46 | IN4148 Diodes |
| CR3 CR4 | 42, 44 | 5.1 V Zener Diodes |
| Q2 Q1 Q3 | 48, 50, 52 | 2N7000 MosFets |
| R1 | 54 | 220K Resistor |
| R2 | 56 | 100 ohm resistor |
| R7 | 58 | 10M ohm resistor |
| R3 | 60 | 150K ohm resistor |
| R4 | 62 | 100K ohm resistor |
| R5 | 64 | 10k ohm resistor |
| R6 | 66 | 1M ohm resistor |
| C1 | 68 | 4.7 nF capacitor |
| C2 | 70 | 10. nF capacitor |
| C3 | 72 | 0.1 µf capacitor |
| C4 | 74 | 1.0 µf capacitor |

Referring now to FIG. 4, operational voltage waveforms are shown at various points A through H within the circuit 30. Point A shows the piezoelectric element electrical signal output 76 when mechanical stress is applied to the top button 15 of the switch housing 12 and also shown is the oscillator output 78 that drives the piezoelectric element 44 to produce the audible sound. Point B shows the pulse output 80 from the switch sensor 45 used to trigger the one-shot circuit 65. Point C shows the one-shot circuit 65 output (OUT) and point D shows the complementary output (OUT) of one-shot circuit 65. Point E shows the pulse width control signal having a leading edge 82 controlled by timing networks R6, C4 and a trailing edge 84 controlled by timing networks R5, C4. Point F shows the re-trigger disable signal 86 which uses timing networks R4, C3 to disable Q2. Point G and Point H show the oscillator 31 outputs. The output of gate U2 34 drives the piezoelectric element (X1) 14 producing the audible buzzing.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A piezoelectric pushbutton switch having audible feedback comprising:
    a housing for enclosing components of said switch;
    a piezoelectric element attached to an inner top surface of said housing wherein applying pressure on the top of said housing causes said piezoelectric element to generate an electrical signal;
    a circuit board electrically connected to said piezoelectric element, for receiving said electrical signal; and
    said circuit board comprises circuit means for enabling said piezoelectric switch to generate an output signal having a predetermined pulse width and for enabling said piezoelectric element to provide said audible feedback.

2. The piezoelectric pushbutton switch as recited in claim 1 wherein said piezoelectric element comprises electrical leads for providing electrical connection to said circuit means.

3. The piezoelectric pushbutton switch as recited in claim 1 wherein said circuit means connected to said piezoelectric element comprises means for providing electrical connections outside of said switch.

4. The piezoelectric pushbutton switch as recited in claim 1 wherein said housing comprises a cap for closing an open end of said switch, said cap comprises an opening for feeding electrical connections outside of said switch.

5. The piezoelectric pushbutton switch as recited in claim 1 wherein said sound produced by said piezoelectric element comprises a buzzing.

6. The piezoelectric pushbutton switch as recited in claim 1 wherein said enabling means comprises an oscillator circuit coupled to said piezoelectric element for producing said audible feedback.

7. The piezoelectric pushbutton switch as recited in claim 1 wherein said housing comprises an epoxy for securing said components of said switch.

8. A piezoelectric switch comprising:
    a piezoelectric element; means for sensing an electrical signal output from said piezoelectric element when activated;
    means connected to said electrical signal output of said sensing means for generating a pulse having a predetermined pulse width; and
    means connected to an output of said pulse generating means for generating an oscillating signal, said oscillating signal being coupled to said piezoelectric element for producing an audible feedback.

9. The piezoelectric switch as recited in claim 8 wherein said piezoelectric element output sensing means comprises a switch sensor circuit.

10. The piezoelectric switch as recited in claim 8 wherein said pulse generating means comprises a one-shot circuit.

11. A method of providing a piezoelectric pushbutton switch having audible feedback comprising the steps of:
    providing a housing for enclosing components of said switch;
    attaching a piezoelectric element to an inner top surface of said housing wherein applying pressure on the top of said housing causes said piezoelectric element to switch and generate an electrical signal;

providing a circuit board in said housing electrically connected to said piezoelectric element for receiving said electrical signal;

generating an output signal having a predetermined pulse width from circuit means on said circuit board receiving said electrical signal; and generating an oscillating signal within said circuit means, said oscillating signal being connected to said piezoelectric element for producing said audible feedback.

12. The method as recited in claim 11 wherein said step of attaching said piezoelectric element to an inner top surface of said housing comprises the step of providing electrical leads for connection to a circuit board.

13. The method as recited in claim 11 wherein said step of providing a circuit board in said housing comprises the step of providing electrical leads extending from said circuit board outside of said housing.

14. The method as recited in claim 11 wherein said step of providing a housing for enclosing components of said switch comprises the steps of adding an epoxy in said housing and a cap for closing an open end of said housing.

15. The method as recited in claim 11 wherein said step of providing said cap comprises the step of including an opening in said cap for feeding electrical connections outside of said housing.

16. A method of providing a piezoelectric switch having audible feedback comprising the steps of:

providing a piezoelectric element in said switch;

sensing an output of said piezoelectric element when said switch is activated;

generating a pulse having a predetermined pulse width with means connected to an output of said means for sensing said piezoelectric element output;

generating an oscillatory signal with means connected to an output of said pulse generating means; and coupling said oscillatory signal to said piezoelectric element to produce said audible feedback.

17. The method as recited in claim 16 wherein said step of activating said switch comprises the step of providing a mechanical stress to a portion of the housing above said piezoelectric element.

18. The method as recited in claim 16 wherein said step of generating a pulse having a predetermined pulse width comprises the step of providing a one-shot circuit.

* * * * *